United States Patent [19]

Forster

[11] 4,182,185
[45] Jan. 8, 1980

[54] DISPLAY DEVICE FOR ROTARY BALANCING MACHINES

[75] Inventor: Brian M. Forster, Sheffield, England

[73] Assignee: GKN Transmissions Limited, Birmingham, England

[21] Appl. No.: 930,179

[22] Filed: Aug. 2, 1978

[30] Foreign Application Priority Data

May 24, 1978 [GB] United Kingdom ............... 21981/78

[51] Int. Cl.² ........................................... G01M 1/22
[52] U.S. Cl. ..................................... 73/462; 364/463; 364/571
[58] Field of Search .................. 73/462; 364/463, 505, 364/508, 571

[56] References Cited

U.S. PATENT DOCUMENTS

| 3,732,737 | 5/1973 | Forster | 73/462 |
| 4,068,532 | 1/1978 | Green et al. | 73/462 |

Primary Examiner—James J. Gill
Attorney, Agent, or Firm—Merriam, Marshall & Bicknell

[57] ABSTRACT

The invention provides a display device for a rotary balancing machine. The balancing machine generates a digital out of balance weight signal of value W at an angular position $\theta$ with respect to a datum angle to indicate value and position of a weight required for balancing purposes. In the display device the weight signal is fed to a pre-programmable read only memory programmed to provide a digital output equivalent to an angle of arc cos ($W/2W_1$) where $W_1$ is a predetermined weight to be used for balancing purposes. Angles $\theta_1$ and $\theta_2$ such that $\Delta\theta=\theta-\theta_1=\theta_2-\theta$ are normally displayed but for calibration purposes can be suppressed to enable signals W and $\theta$ to be displayed. Weights of the predetermined value placed at angles $\theta_1$ and $\theta_2$ should completely balance the wheel.

6 Claims, 1 Drawing Figure

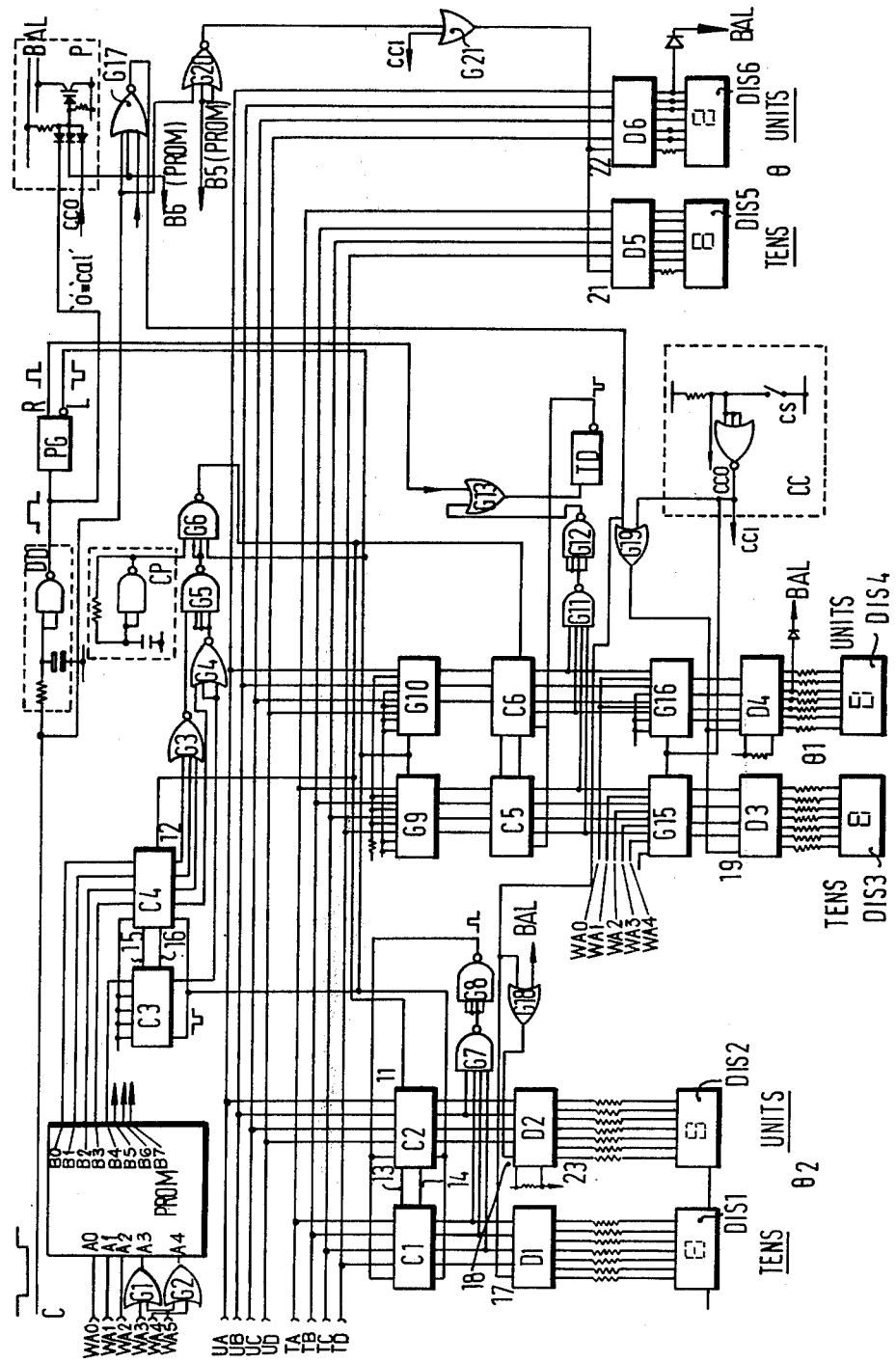

DISPLAY DEVICE FOR ROTARY BALANCING MACHINES

BACKGROUND OF THE INVENTION

The invention relates to display devices for rotary balancing machines.

It is already known for example from U.K. patent specification No. 1,339,724 and the corresponding U.S. Pat. No. 3,732,737 to provide a rotary balancing machine which provides a digital output in the form of one value representative of the balance weight value required to balance a work piece and another digital value indicative of the angular position with respect to a datum at which the weight should be placed. In a wheel balancer for balancing automotive and similar wheels, it is desirable to balance the wheel in two planes to ensure that out of balance couples as well as out of balance forces are taken into consideration when balancing the wheel. The axial positions (that is radial planes) at which weights can be added are defined by the structure of the wheel so that in the case of a wheel balancer, what is required and available from the known balancers is a weight value and an angular position value for each of the two planes.

Considering for the moment only the situation within a single radial plane, it has been proposed in U.S. Pat. No. 3,550,455 that in order to standardise the value of weights which have to be made available, a pair of weights of a predetermined standard value may be employed at angular positions to either side of the nominal position at which a single weight would be placed.

In further detail, when:

W is the value of a single weight required to balance a wheel $\theta$ is the angle with respect to a datum at which weight W should be placed.

$W_1$ is the value of standardised weight $\theta_1$ and $\theta_2$ are angles with respect to the datum at which weights $W_1$ should be placed to be equivalent of weight W at angle $\theta$.

$\Delta\theta$ is equal to $\theta - \theta_1$ and equal to $\theta_2 - \theta$

Then:

$$\theta = \arccos(W/2W_1)$$

It has also been proposed in U.S. Pat. No. 4,068,532 to provide an electronic arithmetic unit to calculate from weight and basic angle signals the corresponding angle positions for weights of a single weight value to replace the single weight at the basic angular position.

The present invention is concerned with certain details of a display device for a rotary balancing machine which display device includes means for receiving signals indicative of values of W and $\theta$, means for calculating corresponding values of $\theta_1$ and $\theta_2$ for weights of predetermined value $W_1$ and means for displaying in digital form the angles $\theta_1$ and $\theta_2$.

SUMMARY OF THE INVENTION

According to one aspect of the present invention there is provided a display device for a rotary balancing machine which machine is of the kind which generates a digital out of balance weight signal of value defined as W and a digital out of balance position signal of angle defined as $\theta$ with respect to a datum angle to give an indication of the value and position of a weight required for balancing purposes and in which balancing requirements are to be converted to digital position values for weights of predetermined uniform value defined as $W_1$, wherein to calculate the angle defined as $\Delta\theta$ in relation to weight position $\theta$ at which weights of value $W_1$ should be placed to give a resultant balancing effect equivalent to W at $\theta$, the signal indicative of weight W is fed to a pre-programmable read only memory device (hereinafter PROM) programmed to give a digital output $\Delta\theta$ equivalent to an angle of arc $\cos(W/2W_1)$, provided $W/2W_1 < 1$, to indicate a requirement for weights of value $W_1$ at angles $\theta_1$ and $\theta_2$ defined by: $\theta_1 = \theta - \Delta\theta$ and $\theta_2 = \theta + \Delta\theta$.

Preferably the PROM is programmed so that when $W/2W_1 = 1$, then $\theta_1$ and $\theta_2$ are each approximately equal to $\theta$. For practical convenience it is preferred to specify small angles either side of $\theta$ to provide for the finite length of the weight.

Preferably the PROM is programmed so that when $W/3W_1 < 1 < W/2W_1$ it gives an output signal of arc $\cos(W - W_1)/2W_1$ together with an indication that a third weight is required at angle $\theta$. The value of this third weight is of course $W_1$.

Preferably the PROM is programmed so that when $W/3W_1 > 1$, it gives an output signal of $\theta$ and suppresses $\theta_1$ and $\theta_2$, indicating a requirement for some weight at angle $\theta$. It is convenient to use a weight of the order of $3W_1$, but this is not critical. This weight addition reduces the out of balance so that balance can be achieved in a subsequent balancing operation.

According to a second aspect of the invention there is provided a display device for a rotary balancing machine which is of the kind which generates a digital out of balance weight signal of value defined as W and digital out of balance angular position signal of angle defined as $\theta$ with respect to a datum angle to give an indication of the value and position of a weight required for balancing purposes including calculating means for calculating in digital form angular position signals defined as $\theta_1$, $\theta_2$ indicative of angles at which weights of a predetermined uniform value should be placed to be equivalent to weight W at angle $\theta$, digital display means for displaying said angular position signals $\theta_1$, $\theta_2$ and means for suppressing said angular position signals $\theta_1$, $\theta_2$ and displaying weight and angular position signals W and $\theta$ in said display means to operate said display device in a calibration mode for calibrating the balancing machine.

A typical balancing machine is such that the relationship between an analogue out of balance force signal and the actual out of balance weight of a work piece is a linear relationship but the actual convertion factor cannot be predetermined and has to be set by adjusting the gain of an amplifier on installation of the machine. The most convenient way to do this is to operate the machine with a test piece incorporating a known out of balance force at a known angle, reading the recorded out of balance weight on a display device and adjusting the gain of the amplifier so that the displayed value corresponds to the actual out of balance weight of the test piece. At the same time, the angle indicating function of the machine can be checked if the out of balance angle is also displayed and corresponds to the out of balance angle of the test piece.

It is inconvenient and inaccurate to use for calibration purposes the display in the form of angle signals for weights of pre-determined value, partly because approximation is required in converting weight signals to angle signals and partly because during calibration it is desirable to use large out of balance weight values which are not particularly easily dealt with by an angle only display system.

BRIEF DESCRIPTION OF THE DRAWINGS

An embodiment of the invention will now be described by way of example only with reference to the accompanying circuit diagram and table 1 which indicates the relationships between various binary signals.

Input Signals

The inputs to the display device are shown at the left hand side of the drawing. The weight input signals are received at terminals $WA_0$ to $WA_5$ respectively. The weight signal is given to the nearest 5 grams and terminal $WA_0$ is used to indicate whether the units figure of the weight value is 0 or 5. Terminals $WA_1$ to $WA_4$ are used to receive the tens figure in binary coded decimal form. The maximum out of balance weight which can be measured is 195 grms, so a single terminal $WA_5$ is needed to indicate whether the hundreds figure should be 0 or 1.

The angle signal $\theta$ is provided in decimal form in units of 5° to correspond to 72 specific angular locations defined in the machine. Units value of the angle is indicated in binary coded decimal (BCD) form on inputs UA UB UC and UD. Similarly, the tens figure for the angular position is indicated in BCD form at inputs TA TB TC and TD.

A control input C is also provided to control the time at which the input signals cause the display device to respond.

These input signals may be derived from a rotary balancing machine as described in my U.S. Pat. No. 3,732,737 the disclosure of which is incorporated herein by reference.

Angle Calculation

The weight input signals are fed directly or indirectly through OR gates $G_1$ and $G_2$ to a programmable read only memory PROM which is programmed as indicated in table 1 to convert the input weight signal to angle signals with respect to the basic single weight angle $\theta$. The display system is intended to indicate a requirement for a maximum of 3 weights of 30 grms each at the same location, in other words for a maximum weight of 90 grms to be added. For this reason, it is unnecessary to provide a separate input to the PROM for the hundreds signal but instead the hundreds signal is gated to two inputs of the tens BCD to ensure that when the actual weight is in the hundreds, the weight signal fed to the PROM is at least 90 grms.

The relationship between the input weight signals $WA_0$ to $WA_5$, PROM input signals $A_0$ to $A_4$ and PROM output signals $B_0$ to $B_7$ is indicated in the table. It can be seen that on all occasions when the weight W exceeds 90 grms the signals at $A_3$ and $A_4$ are '1's so that the total PROM input signal is at least binary 11000, in other words at least 120 grms.

The PROM is programmed so that whenever the inputs are in the form of column A of the table, the outputs are in the form of column B of the table. These outputs indicate the required angle $\Delta\theta$ but also show other functions. Outputs $B_0$ to $B_3$ give the unit figure for $\Delta\theta$ in BCD. Output $B_4$ gives the tens figure for $\Delta\theta$ which is either 1 or 0 in decimal terms because the maximum value for $\Delta\theta$ is 18 units of 5° per unit. Output $B_5$ indicates whether or not $\theta$ should be suppressed or displayed at the display in a display unit intended for use when a third weight $W_1$ is required, that is when W exceeds 60 grms. Output $B_6$ is used to indicate when a balanced condition exists. A balance weight requirement of less than 10 grms is considered to be sufficient for there to be no requirement to add weights. Output $B_7$ is used to indicate that W is greater than 90 grms so that the addition of weights does not result in balance.

Display of $\theta_2$

The BCD inputs UA to UD and TA to TD are fed respectively to decade counters $C_1$ and $C_2$ to set these counters to the value of $\theta$. The units counter $C_2$ can be counted up from an input 11 which receives a train of pulses corresponding to $\Delta\theta$ in a way which will now be explained.

Returning to the output of the PROM, and particularly outputs $B_0$ to $B_4$ inclusive, these are fed to two decade counters $C_3$ and $C_4$ respectively and are set to $\Delta\theta$. Outputs from the counters $C_3$ and $C_4$ are connected through a network of NOR gates $G_3$ and $G_4$ and NAND gate $G_5$ to clock pulse NAND gate $G_6$ which controls the output of clock pulses from a clock pulse generator CP. The output train of clock pulses is connected both to the counter $C_2$ at input 11 and to counter $C_4$ at input 12. Counters $C_1$ and $C_2$ are connected in cascade by connections 13 and 14 and counters $C_3$ and $C_4$ are similarly connected in cascade by connections 15 and 16. Thus the counters $C_3$ and $C_4$ together are counted down in sequence with corresponding counting up of counters $C_1$ and $C_2$. This counting continues until all the outputs from counters $C_3$ and $C_4$ are in the 0 state, meaning that the cascade of counters $C_3$ and $C_4$ has been counted to 0 and at that stage a signal passes through the network of gates $G_3$ $G_4$ and $G_5$ to an input of NAND gate $G_6$ so that it cuts off further clock pulses. In this way, counters $C_1$ and $C_2$ are counted up by the original count of counters $C_3$ and $C_4$ so that the total count of counters $C_1$ and $C_2$ becomes equal to the count of $\theta$ plus the count of $\Delta\theta$. This count is representative of $\theta_2$ because $\theta_2$ equals $\theta$ plus $\Delta\theta$.

In order to cater for the situation when $\theta$ plus $\Delta\theta$ is greater than 71 so that $\theta_2$ should be displayed as $\theta$ plus $\Delta\theta$ minus 72, the cascade connection of counters $C_1$ and $C_2$ includes a loop with NAND gates $G_7$ and $G_8$ to reset the counter to 0 when the output reaches 72.

The outputs from counters $C_1$ and $C_2$ are connected to decoders $D_1$ and $D_2$ which are in turn connected to conventional seven segment display units $DIS_1$ and $DIS_2$. Output from the decoders is normally inhibited until the counting operation has been completed through connections 17 and 18 of the decoders $D_1$ and $D_2$, the sources of which will be described subsequently but when the final value of $\theta_2$ has been calculated as described above, the inhibition is cancelled so that $\theta_2$ is displayed in the display units $DIS_1$ and $DIS_2$.

Display of $\theta_1$ $\theta_1$ is calculated and displayed in a way which is generally similar to the calculation and display of $\theta_2$. A first difference is associated with a possible counting down through 0 after which the next down count should be 71. The value of $\theta$ is fed from inputs UA to UD and TA to TD to two two-way multiplexer devices $G_9$ and $G_{10}$ which are set to $\theta$ in response to a load command signal which will be described subsequently and which at all other times are set to 71. The outputs from these two-way multiplexers $G_9$ and $G_{10}$ are connected to two decade counters $C_5$ and $C_6$ so that these can be set to $\theta$. Counters $C_5$ and $C_6$ can be counted down by the gated clock pulses from gate $G_6$ in exactly the same way as counters $C_1$ and $C_2$ were counted up. At the termination of the counting operation, the count stored in counters $C_5$ and $C_6$ then amounts to $\theta - \Delta\theta$, that is $\theta_1$.

In counting down, the count required immediately after 0 is not 99 but is 71. This is because a complete circle of angular movement is constituted by 72 divisions of 5° each. To achieve this count of 71, an output of 99 is detected by NAND gates $G_{11}$ and $G_{12}$ which signal the counters $C_5$ and $C_6$ via OR gate $G_{13}$ and one shot TD to reset the counters to the value contained in multiplexers $G_9$ and $G_{10}$ that is the value 71.

The output from the counters $C_5$ and $C_6$ is then normally passed through two-way multiplexers $G_{15}$ and $G_{16}$ to decoders $D_3$ and $D_4$. A display enabling signal is applied to inputs 19 and 20 of the decoder when the counting has been completed so that the $\theta_1$ signal stored in counters $C_5$ and $C_6$ can be displayed in display units $DIS_3$ and $DIS_4$.

The other inputs which can be fed to the $\theta_1$ display units $DIS_3$ and $DIS_4$ via multiplexers $G_{15}$ and $G_{16}$ will be described subsequently in relation to the calibration mode of the complete system.

Display of $\theta$

The signals representative of $\theta$ at inputs UA to UD and TA to TD are also fed directly to decoders $D_5$ and $D_6$ which in turn are connected to display units $DIS_5$ and $DIS_6$.

As described above in relation to the PROM device, no weight is to be placed at angle $\theta$ when the total out of balance is less than 60 grms but an output display of $\theta$ is required when $\Delta\theta$ is greater than 60 grms. An appropriate display enabling signal derived in a way to be described subsequently is applied to inputs 21 and 22 of decoders $D_5$ and $D_6$ to enable $\theta$ to be displayed in display units $DIS_5$ and $DIS_6$.

Display Enabling Signals

The normal display enabling requirements are that no output should be displayed either when the balancer is running up to speed or while the counting calculations are taking place. Once the balancer has reached its appropriate speed and the calculations have been completed, the appropriate information should be displayed and should continue to be displayed until either the machine is switched off or a new balancing operation is commenced. An external display enabling signal is applied to input C.

The display enabling signal at input C is a 0 and this signal is fed directly to NOR gate $G_{17}$ and from there is fed directly to display enabling input 17 and through OR gates $G_{18}$ and $G_{19}$ to display enabling inputs 18, 19 and 20. Thus $\theta_1$ and $\theta_2$ are normally displayed in response to a 0 on input C.

Output $B_7$ from the PROM device is connected to gate $G_{17}$ to inhibit display of $\theta_1$ or $\theta_2$ when the weight W exceeds 90 grms.

The 0 signal from input C is also supplied through a NOR gate $G_{20}$ and OR gate $G_{21}$ to display enabling inputs 21 and 22 of decoders $D_5$ and $D_6$ to enable $\theta$ to be displayed in display units $DIS_5$ and $DIS_6$. When W is between 0 and 60 grms an inhibit signal from output $B_5$ of the PROM device is fed to gate $G_{20}$ to inhibit passage of the display signal through that gate and therefore to prevent display of $\theta$.

Display of Balanced Condition

When the out of balance weight is less than 10 grms no addition of weights to a wheel is required and the display of $\theta_1$ $\theta_2$ and $\theta$ is inhibited. The inhibit signal is derived from output $B_6$ of the PROM device which is connected to gate $G_{17}$ to inhibit the display enabling signal from this gate to decoders $D_1$ $D_2$ $D_3$ and $D_4$. With such a low weight, display of $\theta$ is automatically inhibited as previously described. A display enabling signal from output $B_6$ reaches decoder $D_2$ through a second input of gate $G_{18}$. Output $B_6$ is also connected to terminal 23 of decoder $D_2$ to cause the decoder to illuminate all 7 display elements and thus exhibit an 8 which in this situation is intended to be read as a B. Output $B_6$ also activates a power source P which provides power to a bus rail BAL which is in turn connected directly to 3 appropriate elements of display device $DIS_4$ and 6 appropriate elements of display device $DIS_6$ so that these display devices display an A and L respectively. In the display equipment, display units $DIS_2$ $DIS_4$ $DIS_6$ are arranged in line so that the complete display has the form BAL indicative of balance of the wheel.

Operation in the Calibration Mode

In the calibration mode, a calibration circuit CC is rendered operative by closing calibration switch CS so that a 1 signal is developed at output $CC_1$ and a 0 signal (as opposed to a previous 1 signal) at output $CC_0$. The signal from $CC_1$ is supplied to the two-way multiplexers $G_{15}$ and $G_{16}$ to switch these gates over from counters $C_5$ and $C_6$ to inputs $WA_0$ to $WA_4$ respectively. This causes the display devices $DIS_3$ and $DIS_4$ to display the out of balance weight in grms instead of displaying $\theta_1$. As out of balance weights used during calibration are less than 100 grms, there is no requirement for displaying the 100's element of weight W from input $WA_5$. An output from $CC_1$ is also fed to gate $G_{21}$ to provide an enabling signal at inputs 21 and 22 of decoders $D_5$ and $D_6$ so that $\theta$ is displayed in display devices $DIS_5$ and $DIS_6$. Output $CC_0$ from the calibration circuit CC is connected to the power source P to inhibit supply of power to the bus rail BAL and thus inhibit the A and the L of the normal balance signal. However, in order to enable balance still to be indicated during operation in the calibration mode, the possible display of a B in display unit $DIS_2$ when the out of balance weight is less than 10 grms is not inhibited. Because greater accuracy is required during calibration than in normal operation, the actual out of balance weight W is displayed in display units $DIS_3$ and $DIS_4$ even when nominal balance is indicated.

Loading and Re-Setting of the Complete System

It is necessary to ensure that the counters $C_1$ to $C_6$ respectively do not become connected to their inputs until stable signals have been achieved. It is also necessary to ensure that they do not remain connected to their inputs after the beginning of the counting operation. For this reason a load signal of short duration is required shortly after the appearance of the display signal at control input C. For this reason input C is connected through a delay device DD to a one shot PG which generates a load command signal pulse at output L shortly after the display signal occurs at the control input C. This load signal is supplied to counters $C_1$, $C_2$, $C_3$ and $C_4$ directly and to multiplexers $G_9$ and $G_{10}$ for counters $C_5$ and $C_6$ so that the counters are loaded. The load signal is also supplied to gate $G_6$, which controls the counting operation and inhibits the supply of clock pulses for a sufficient time to ensure that the counters are loaded correctly.

General Operation

In operation of the wheel balancer, a wheel is mounted on the spindle of the machine and is spun up to speed in order to generate the W and $\theta$ signals. If the display device indicates that the wheel is balanced, no action is necessary. If on the other hand, there is an out of balance between 10 and 60 grms, $\theta_1$ and $\theta_2$ are displayed as appropriate values for addition of 30 grm weights to correct the out of balance. If the out of balance weight is between 65 and 90 grms, $\theta$, $\theta_1$ and $\theta_2$ are all displayed to indicate a requirement for weight at the 3 locations to achieve balance. If the out of balance weight is greater than 90 grms, and there is no specific upper limit to the out of balance weight which can be catered for, a weight should be added at position $\theta$. If the only weights available are 30 grm weights, it is desirable to add 2 of these at position $\theta$, but it is preferable to use single weight of about 60 to 90 grms if this is available. The actual value of this weight is unimportant. When the new weight has been added, a new balancing operation is carried out and it is to be hoped that with the previous addition of 60 grms or so, the remaining out of balance should be less than 90 grms so that complete balance can be achieved with two or three additional 30 grm weights. In the extremely unusual situation where a weight of approximately 60 grms does not bring the wheel within 90 grms of balance, the display device will again illuminate only the angle $\theta$, indicating that further weight should be applied to this position before carrying out a further balancing operation. If necessary, this operation can be completed an indefinite number of times until balance is achieved.

As a check on the correct positioning of weights, it is always recommended that when weights have been added, a further balancing operation should be carried out as a check to ensure that balance has been brought within the 10 grm limit set by the machine.

Balancing in two Planes

As thus far described, the display device operates solely to display balancing requirements in one plane of a wheel. In the case of a balancer intended to balance couples as well as out of balance forces, a second complete device corresponding to that described above should be provided to enable the requirements for balancing in the other plane to be displayed. As an alternative, switching means could be provided for switching the system described between input data for two planes and each plane could be balanced in turn.

General

Although the detailed description has for convenience made reference to weights of 30 grms, the balancing machine could be calibrated in such a way that the input weight signals represent other weights besides 5 grms per unit in which case a different standard weight should be used. Alternatively, the PROM device could be re-programmed to cater for weights other than 30 grms.

Although the detailed description of the invention has for convenience made reference to its use in connection with a wheel balancer, the invention is not so limited and could be used in connection with any rotary balancing machine which provides a suitable digital output.

TABLE 1

| Weight | WA 5 | 4 | 3 | 2 | 1 | 0 | A 4 | 3 | 2 | 1 | 0 | B 7 | 6 | 5 | 4 | 3 | 2 | 1 | 0 | ΔΘ |
|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 1 | 1 | 1 | 1 | 0 | 0 | 0 | 18 |
| 5 | 0 | 0 | 0 | 0 | 0 | 1 | 0 | 0 | 0 | 0 | 1 | 0 | 1 | 1 | 1 | 0 | 1 | 1 | 1 | 17 |
| 10 | 0 | 0 | 0 | 0 | 1 | 0 | 0 | 0 | 0 | 1 | 0 | 0 | 0 | 1 | 1 | 0 | 1 | 1 | 0 | 16 |
| 15 | 0 | 0 | 0 | 0 | 1 | 1 | 0 | 0 | 0 | 1 | 1 | 0 | 0 | 1 | 1 | 0 | 1 | 0 | 1 | 15 |
| 20 | 0 | 0 | 0 | 1 | 0 | 0 | 0 | 0 | 1 | 0 | 0 | 0 | 0 | 1 | 1 | 0 | 1 | 0 | 0 | 14 |
| 25 | 0 | 0 | 0 | 1 | 0 | 1 | 0 | 0 | 1 | 0 | 1 | 0 | 0 | 1 | 1 | 0 | 0 | 1 | 1 | 13 |
| 30 | 0 | 0 | 0 | 1 | 1 | 0 | 0 | 0 | 1 | 1 | 0 | 0 | 0 | 1 | 1 | 0 | 0 | 1 | 0 | 12 |
| 35 | 0 | 0 | 0 | 1 | 1 | 1 | 0 | 0 | 1 | 1 | 1 | 0 | 0 | 1 | 1 | 0 | 0 | 0 | 1 | 11 |
| 40 | 0 | 0 | 1 | 0 | 0 | 0 | 0 | 1 | 0 | 0 | 0 | 0 | 0 | 1 | 1 | 0 | 0 | 0 | 0 | 10 |
| 45 | 0 | 0 | 1 | 0 | 0 | 1 | 0 | 1 | 0 | 0 | 1 | 0 | 0 | 1 | 0 | 1 | 0 | 0 | 0 | 8 |
| 50 | 0 | 0 | 1 | 0 | 1 | 0 | 0 | 1 | 0 | 1 | 0 | 0 | 0 | 1 | 0 | 0 | 1 | 1 | 1 | 7 |
| 55 | 0 | 0 | 1 | 0 | 1 | 1 | 0 | 1 | 0 | 1 | 1 | 0 | 0 | 1 | 0 | 0 | 1 | 0 | 1 | 5 |
| 60 | 0 | 0 | 1 | 1 | 0 | 0 | 0 | 1 | 1 | 0 | 0 | 0 | 0 | 1 | 0 | 0 | 0 | 1 | 0 | 2 |
| 65 | 0 | 0 | 1 | 1 | 0 | 1 | 0 | 1 | 1 | 0 | 1 | 0 | 0 | 0 | 1 | 0 | 0 | 0 | 1 | 11 |
| 70 | 0 | 0 | 1 | 1 | 1 | 0 | 0 | 1 | 1 | 1 | 0 | 0 | 0 | 0 | 1 | 0 | 0 | 0 | 0 | 10 |
| 75 | 0 | 0 | 1 | 1 | 1 | 1 | 0 | 1 | 1 | 1 | 1 | 0 | 0 | 0 | 0 | 1 | 0 | 0 | 0 | 8 |
| 80 | 0 | 1 | 0 | 0 | 0 | 0 | 1 | 0 | 0 | 0 | 0 | 0 | 0 | 0 | 0 | 0 | 1 | 1 | 1 | 7 |
| 85 | 0 | 1 | 0 | 0 | 0 | 1 | 1 | 0 | 0 | 0 | 1 | 0 | 0 | 0 | 0 | 0 | 1 | 0 | 1 | 5 |
| 90 | 0 | 1 | 0 | 0 | 1 | 0 | 1 | 0 | 0 | 1 | 0 | 0 | 0 | 0 | 0 | 0 | 0 | 1 | 0 | 2 |
| 95 | 0 | 1 | 0 | 0 | 1 | 1 | 1 | 0 | 0 | 1 | 1 | 1 | 0 | 0 | 0 | 0 | 0 | 0 | 0 | 0 |
| 95+ | 1 | ← | ← | any | → | → | 1 | 1 | ← | any | → | 1 | 0 | 0 | 0 | 0 | 0 | 0 | 0 | 0 |

TABLE 1-continued

| | WA | | | | | A | | | | B | | | | | | | |
|---|---|---|---|---|---|---|---|---|---|---|---|---|---|---|---|---|---|
| Weight | 5 | 4 | 3 | 2 | 1 | 0 | 4 | 3 | 2 | 1 | 0 | 7 | 6 | 5 | 4 | 3 | 2 | 1 | 0 | Δ0 |

I claim:

1. In a rotary balancing machine of the kind which generates a digital out of balance weight signal of a value defined as W and a digital out of balance position signal of angle defined as $\theta$ with respect to a datum angle to give an indication of the value and position of a weight required for balancing purposes, a display device for indicating digital position values at which weights of predetermined uniform value defined as $W_1$ should be placed to give a resultant balancing effect equivalent to weight W at $\theta$, the display device comprising:

a pre-programmable read only memory arranged to receive said weight signal, said memory being pre-programmed to provide a digital output $\Delta\theta$ equivalent to an angle arc COS $(W/2W_1)$ when W is in the range such that $W/2W_1 < 1$, the pre-programmable read only memory also being pre-programmed to provide other digital outputs in response to specific values of W when W is outside the range such that $W/2W_1$ is less than 1 whereby requirements for achieving balance can be indicated when W is outside the range of $W/2W_1 < 1$.

first means for receiving the position signal value $\theta$, means for subtracting the value $\Delta\theta$ from the value $\theta$ to provide a digital value defined as $\theta_1$, second means for receiving the position signal value $\theta$, means for adding the value $\Delta\theta$ to the value $\theta$ to provide a digital value defined as $\theta_2$, and means for displaying the values of $\theta_1$, and $\theta_2$ to provide said digital position signals for weights $W_1$.

2. In a rotary balancing machine of the kind which generates a digital out of balance weight signal of a value defined as W and a digital out of balance position signal of angle defined as $\theta$ with respect to a datum angle to give an indication of the value and position of a weight required for balancing purposes, a display device for indicating digital position values $\theta_1$ and $\theta_2$ at which weights of predetermined uniform value defined as $W_1$ should be placed to give a resultant balancing effect equivalent to W at $\theta$, digital calculating means for deriving $\theta_1$ and $\theta_2$ such that $\theta_1 = \theta - \Delta\theta$ and $\theta_2 = \theta + \Delta\theta$ where $\Delta\theta = $ arc COS $(W/2W_1)$, means for displaying the values of $\theta_1$ and $\theta_2$ to provide said digital position signals for weights $W_1$ and means for suppressing the angular position signals $\theta_1$ and $\theta_2$ and displaying weight and angular position signals W and $\theta$ in said display means to operate said rotary balancing machine in a calibration mode for calibrating the machine.

3. In a rotary balancing machine of the kind which generates a digital out of balance weight signal of a value defined as W and a digital out of balance position signal of angle defined as $\theta$ with respect to a datum angle to give an indication of the value and position of a weight required for balancing purposes, a display device for indicating digital position values at which weights of predetermined uniform value defined as $W_1$ should be placed to give a resultant balancing effect equivalent to weight W at $\theta$, the display device comprising;

a pre-programmable read only memory arranged to receive said weight signal, said memory being pre-programmed to provide a digital output $\Delta\theta$ equivalent to an angle arc COS $(W/2W_1)$ when W is in the range such that $W/2W_1 < 1$, first means for receiving the position signal value $\theta$, means for subtracting the value $\Delta\theta$ from the value $\theta$ to provide a digital value defined as $\theta_1$, second means for receiving the position signal value $\theta$, means for adding the value $\Delta\theta$ to the value $\theta$ to provide a digital value defined as $\theta_2$, and means for displaying the values of $\theta_1$ and $\theta_2$ to provide said digital position signals for weights $W_1$, wherein the pre-programmable read only memory is so programmed that when $W/2W_1 = 1$ then $\Delta\theta$ is given as a small angle such that $\theta_1$ and $\theta_2$ are approximately equal to $\theta$ but are spaced a finite distance to enable the application of two independent weights of value $W_1$.

4. In a rotary balancing machine of the kind which generates a digital out of balance weight signal of a value defined as W and a digital out of balance position signal of angle defined as $\theta$ with respect to a datum angle to give an indication of the value and position of a weight required for balancing purposes, a display device for indicating digital position values at which weights of predetermined uniform value defined as $W_1$ should be placed to give a resultant balancing effect equivalent to weight W at $\theta$, the display device comprising;

a pre-programmable read only memory arranged to receive said weight signal, said memory being pre-programmed to provide a digital output $\Delta\theta$ equivalent to an angle arc COS $(W/2W_1)$ when W is in the range such that $W/2W_1 < 1$, first means for receiving the position signal value $\theta$, means for subtracting the value $\Delta\theta$ from the value $\theta$ to provide a digital value defined as $\theta_1$, second means for receiving the position signal value $\theta$, means for adding the value $\Delta\theta$ to the value $\theta$ to provide a digital value defined as $\theta_2$, and means for displaying the values of $\theta_1$ and $\theta_2$ to provide said digital position signals for weights $W_1$, said pre-programmable read only memory having a further output and being so programmed that when $W/3W_1 > 1$ a signal is provided on the further output but no signal is provided for outputs $\theta_1$ and $\theta_2$, the balancing machine further comprising third means for receiving the position signal value $\theta$ and means for displaying the value of $\theta$ in response to said signal on said further output of the pre-programmable read only memory.

5. In a rotary balancing machine of the kind which generates a digital out of balance weight signal of a value defined as W and a digital out of balance position signal of angle defined as $\theta$ with respect to a datum angle to give an indication of the value and position of a weight required for balancing purposes, a display device for indicating digital position values at which weights of predetermined uniform value defined as $W_1$ should be placed to give a resultant balancing effect equivalent to weight W at $\theta$, the display device comprising;

a pre-programmable read only memory arranged to receive said weight signal, said memory being pre-programmed to provide a digital output $\Delta\theta$ equivalent to an angle arc COS $(W/2W_1)$ when W is in the range such that $W/2W_1 < 1$, first means for receiving the position signal value $\theta$, means for subtracting the value $\Delta\theta$ from the value $\theta$ to provide a digital value defined as $\theta_1$, second means for receiving the position signal value $\theta$, means for adding the value $\Delta\theta$ to the value $\theta$ to provide a digital value defined as $\theta_2$, and means for displaying the values of $\theta_1$ and $\theta_2$ to provide said digital position signals for weights $W_1$, said first means for receiving the position signal value $\theta$ being a first counter, said means for subtracting the value $\Delta\theta$ being a further counter operatively connected to the pre-programmable read only memory to receive the value $\Delta\theta$, the rotary balancing machine also comprising a counting pulse generator and gating means for gating counting pulses to said counters for counting both counters down, and means operatively connected to the gating means to cut off the supply of counting pulses when said further counter has been counted down to zero.

6. In a rotary balancing machine of the kind which generates a digital out of balance weight signal of a value defined as W and a digital out of balance position signal of angle defined as $\theta$ with respect to a datum angle to give an indication of the value and position of a weight required for balancing purposes, a display device for indicating digital position values at which weights of predetermined uniform value defined as $W_1$ should be placed to give a resultant balancing effect equivalent to weight W at $\theta$, the display device comprising;

a pre-programmable read only memory arranged to receive said weight signal, said memory being pre-programmed to provide a digital output $\Delta\theta$ equivalent to an angle arc COS $(W/2W_1)$ when W is in the range such that $W/2W_1 < 1$, first means for receiving the position signal value $\theta$, means for subtracting the value $\Delta\theta$ from the value $\theta$ to provide a digital value defined as $\theta_1$, second means for receiving the position signal value $\theta$, means for adding the value $\Delta\theta$ to the value $\theta$ to provide a digital value defined as $\theta_2$, and means for displaying the values of $\theta$, and $\theta_2$ to provide said digital position signals for weights $W_1$, said second means for receiving the position signal value $\theta$ being a second counter, said means for adding the value $\Delta\theta$ being a further counter operatively connected to the pre-programmable read only memory to receive the value $\Delta\theta$, the rotary balancing machine also comprising a counting pulse generator and gating means for gating counting pulses to said counters for counting the second counter up and the further counters down, and means operatively connected to the gating means to cut off the supply of counting pulses when said further counter has been counted down to zero.

* * * * *